United States Patent [19]
Obara

[11] Patent Number: 5,469,386
[45] Date of Patent: Nov. 21, 1995

[54] SEMICONDUCTOR INTEGRATED CIRCUIT DEVICE HAVING LOW-POWER CONSUMPTION SIGNAL INPUT CIRCUIT RESPONSIVE TO HIGH-SPEED SMALL-AMPLITUDE INPUT SIGNAL

[75] Inventor: Takashi Obara, Tokyo, Japan

[73] Assignee: NEC Corporation, Tokyo, Japan

[21] Appl. No.: 296,164

[22] Filed: Aug. 25, 1994

[30] Foreign Application Priority Data

Aug. 26, 1993 [JP] Japan .................................. 5-211323

[51] Int. Cl.$^6$ .................................................. G11C 7/00
[52] U.S. Cl. .................... 365/189.07; 365/233; 365/222; 365/189.08; 365/191
[58] Field of Search ............................ 365/189.07, 233, 365/222, 189.08, 191, 189.03

[56] References Cited

U.S. PATENT DOCUMENTS

| | | | |
|---|---|---|---|
| 4,989,183 | 1/1991 | Kumanoya et al. | 365/222 |
| 5,278,797 | 1/1994 | Jean et al. | 365/222 |
| 5,329,490 | 7/1994 | Murotani | 365/222 |
| 5,335,201 | 8/1994 | Walther et al. | 365/222 |

FOREIGN PATENT DOCUMENTS 2111777  6/1983  United Kingdom .

OTHER PUBLICATIONS

Patent Abstracts of Japan; vol. 10, No. 274 (P498) Sep. 18, 1986 & JP–A–61 096 589.
Patent Abstracts of Japan; vol. 12, No. 199 (P–714) 9 Jun. 1988 & JP–A–63 002 193.

*Primary Examiner*—David C. Nelms
*Assistant Examiner*—Huan Hoang
*Attorney, Agent, or Firm*—Sughrue, Mion, Zinn, Macpeak & Seas

[57] ABSTRACT

A semiconductor synchronous dynamic random access memory device is responsive to a clock signal and a clock enable signal for selectively carrying out internal sequences such as a read-out sequence, a write-in sequence and a self-refreshing sequence, and a signal input unit assigned to the clock enable signal has a complementary logic gate type signal input circuit enabled in a self-refreshing sequence for receiving the clock enable signal and a current-mirror type signal input circuit enabled in other sequences for receiving the clock enable signal so that the current consumption of the signal input unit is decreased during the self-refreshing sequence.

6 Claims, 12 Drawing Sheets

SEMICONDUCTOR INTEGRATED CIRCUIT DEVICE HAVING LOW-POWER CONSUMPTION SIGNAL INPUT CIRCUIT RESPONSIVE TO HIGH-SPEED SMALL-AMPLITUDE INPUT SIGNAL

FIELD OF THE INVENTION

This invention relates to a semiconductor integrated circuit device and, more particularly, to a semiconductor integrated circuit device having a low-power consumption signal input circuit for receiving a high-speed small-amplitude input signal.

DESCRIPTION OF THE RELATED ART

The signal input circuit of the semiconductor integrated circuit device is expected to serve as an interface between internal circuits and other semiconductor integrated circuit devices implemented by TTL (Transistor-Transistor-Logic) circuits and/or CMOS (Complementary Metal-Oxide-Semiconductor ) circuits, and the basic requirements for the signal input circuit are large margin in sensitivity, high-speed response to an input signal, low-power consumption, simplicity and small occupation space.

The prior art signal input circuits are largely categorized in two groups, and the first group is implemented by CMOS circuits. Two examples are illustrated in FIGS. 1 and 2 of the drawings, and are enabled with an enable signal EBL1 for responding to an input signal Sin. In the following description, a high voltage level and a low voltage level are assumed to be corresponding to logic "1" level and logic "0" level, respectively.

The first prior art signal input circuit shown in FIG. 1 comprises a series combination of a p-channel enhancement type switching transistor Qp1 and n-channel enhancement type switching transistors Qn2 and Qn3 coupled between a positive power voltage line Vdd and a ground voltage line GND, an n-channel enhancement type protective transistor Qn4 coupled between an input signal node IN and the gate electrode of the n-channel enhancement type switching transistor Qn2, a p-channel enhancement type load transistor Qp5 coupled between the positive power voltage line Vdd and the common drain node N1 in the series combination and two output inverters INV1 and INV2 coupled to the drain node N2 of the p-channel enhancement type load transistor Qp5 for producing an output signal Sout. The input signal Sin is supplied to the gate electrode of the p-channel enhancement type switching transistor Qp1 and through the n-channel enhancement type protective transistor Qn4 to the gate electrode of the n-channel enhancement type switching transistor Qn2. The enable signal EBL1 is supplied through a control node CTL to the gate electrode of the n-channel enhancement type switching transistor Qn3 and the gate electrode of the p-channel enhancement type load transistor Qp5.

While the enable signal EBL1 is maintained at the low voltage level, the n-channel enhancement type switching transistor Qn3 is turned off, and the p-channel enhancement type load transistor Qp5 is turned on. Therefore, the high voltage level is supplied through the p-channel enhancement type load transistor Qp5 to the input node of the inverter INV1 at all times regardless of the input signal Sin, and the output signal Sout is fixed to the high voltage level.

On the other hand, if the enable signal EBL1 is changed to the high voltage level, the n-channel enhancement type switching transistor Qn3 turns on, and the p-channel enhancement type load transistor Qp5 turns off. As a result, the complementary inverter Qp1/Qn2 becomes responsive to the input signal Sin, and the p-channel enhancement type switching transistor Qp1 and the n-channel enhancement type switching transistor Qn2 complementarily turn on and off for coupling the common drain node N1 to one of the positive power voltage line Vdd and the ground voltage line GND. Thus, the first example shown in FIG. 1 achieves the NAND operation on the enable signal EBL1 and the input signal Sin.

The second example shown in FIG. 2 comprises a series combination of p-channel enhancement type switching transistors Qp6 and Qp7 and an n-channel enhancement type switching transistor Qn8 coupled between the positive power voltage line Vdd and the ground voltage line GND, an n-channel enhancement type protective transistor Qn9 coupled between an input node IN and the gate electrode of the n-channel enhancement type switching transistor Qn8, an n-channel enhancement type discharging transistor Qn10 coupled between the common drain node N3 in the series combination and the ground voltage line GND and an output inverter INV3. The input signal Sin is supplied to the gate electrode of the p-channel enhancement type switching transistor Qp7 and through the n-channel enhancement type protective transistor Qn9 to the gate electrode of the n-channel enhancement type switching transistor Qn8. The enable signal EBL1 is supplied through a control node CTL to the gate electrode of the p-channel enhancement type switching transistor Qp6 and the gate electrode of the n-channel enhancement type discharging transistor Qn10.

While the enable signal EBL2 is maintained at the high voltage level, the p-channel enhancement type switching transistor Qp6 is turned off, and the n-channel enhancement type protective transistor Qn10 is turned on. Therefore, the low voltage level is supplied through the n-channel enhancement type discharging transistor Qn10 to the input node of the output inverter INV3 at all times regardless of the input signal Sin, and the output signal Sout is fixed to the high voltage level.

On the other hand, if the enable signal EBL2 is changed to the low voltage level, the p-channel enhancement type switching transistor Qp6 turns on, and the n-channel enhancement type discharging transistor Qn10 turns off. As a result, the complementary inverter Qp7/Qn8 becomes responsive to the input signal Sin, and the p-channel enhancement type switching transistor Qp7 and the n-channel enhancement type switching transistor Qn8 complementarily turn on and off for coupling the common drain node N3 to one of the positive power voltage line Vdd and the ground voltage line GND. Thus, the second example shown in FIG. 2 achieves the NOR operation on the enable signal EBL2 and the input signal Sin.

The other group is featured by a current-mirror circuit, and three examples are respectively illustrated in FIGS. 3 to 5. The first example of the other group is shown in FIG. 3, and comprises a parallel combination of p-channel enhancement type load transistors Qp11, Qp12 coupled at the source nodes thereof to the positive power voltage line Vdd, a current mirror circuit 1, two n-channel enhancement type protective transistors Qn13 and Qn14 coupled at the gate electrodes thereof to the positive power voltage line Vdd, an n-channel enhancement type discharging transistor Qn15 coupled between the output node N5 of the current mirror circuit 1 and the ground voltage line and output inverter INV4 coupled to the output node N5 for producing an output signal Sout. The current mirror circuit 1 comprises two p-channel enhancement type variable load transistors Qp16 and Qp17 coupled to the drain nodes of the p-channel enhancement type switching transistors Qp11 and Qp12 and two n-channel enhancement type amplifying transistors Qn18 and Qn19 coupled between the p-channel enhancement type variable load transistors Qp16 and Qp17 and the ground voltage line GND, and the n-channel enhancement type protective transistors Qn13 and Qn14 are coupled between a reference node REF and an input node IN and the gate electrodes of the n-channel enhancement type amplifying transistors Qn18 and Qn19. The enable signal EBL3 is supplied through a control node CTL to the gate electrodes of the p-channel enhancement type switching transistors Qp11 and Qp12 and the gate electrode of the n-channel enhancement type discharging transistor Qn15.

While the enable signal EBL3 is staying in the high voltage level, the p-channel enhancement type switching transistors Qp11 and Qp12 are turned off, and the n-channel enhancement type discharging transistor Qn15 is turned on. For this reason, the output node N5 is fixed to the ground voltage level, and the output inverter INV4 keeps the output signal Sout in the high voltage level regardless of the input signal Sin.

On the other hand, if the enable signal EBL3 is changed to the low voltage level, the p-channel enhancement type switching transistors Qp11 and Qp12 turn on, and the n-channel enhancement type discharging transistor Qn15 turns off. As a result, the current mirror circuit 1 is powered through the p-channel enhancement type switching transistors Qp11 and Qp12, and the output node N5 is isolated from the ground voltage line GND.

The reference signal Sref is indicative of a threshold of logic level for the input signal Sin. Namely, the current mirror circuit 1 compares the voltage level of the input signal Sin with the threshold indicated by the reference signal Sref, and changes the voltage level at the output node N5 between the high voltage level and the low voltage level. The output inverter INV4 changes the voltage level of the output signal Sout between the high voltage level and the low voltage level depending upon the voltage level at the output node N5. The first example shown in FIG. 3 is enabled with the enable signal of logic "0" level, and is of the NOR type.

The second example of the other group is illustrated in FIG. 4, and comprises a current mirror circuit 2 coupled to the positive power voltage line Vdd, two n-channel enhancement type switching transistors Qn20 and Qn21 coupled between the current mirror circuit 2 and a ground voltage line GND, a p-channel enhancement type load transistor Qp22 coupled between the positive power voltage line Vdd and an output node of the current mirror circuit 2, two n-channel enhancement type protective transistors Qn23 and Qn24 coupled between the current mirror circuit 2 and reference/input nodes REF and IN, an inverter INV5 for shifting the switching transistors Qn20, Qn21 and Qp22 and an output inverter INV6 for producing an output signal Sout. The current mirror circuit 2 is similar in arrangement to the current mirror circuit 1.

While the enable signal EBL4 is staying in the low voltage level, the n-channel enhancement type switching transistors Qn20 and Qn21 are turned off, and the p-channel enhancement type load transistor Qp22 is turned on. For this reason, the output node N6 is fixed to the positive power voltage level Vdd, and the output inverter INV6 keeps the output signal Sout in the low voltage level regardless of the input signal Sin.

On the other hand, if the enable signal EBL4 is changed to the high voltage level, the n-channel enhancement type switching transistors Qn20 and Qn21 turn on, and the p-channel enhancement type load transistor Qp22 turns off. As a result, the current mirror circuit 2 is activated, and the output node N6 is isolated from the positive power voltage line Vdd.

The current mirror circuit 2 compares the voltage level of the input signal Sin with the threshold indicated by the reference signal Sref, and changes the voltage level at the output node N6 between the high voltage level and the low voltage level. The output inverter INV6 changes the voltage level of the output signal Sout between the high voltage level and the low voltage level depending upon the voltage level at the output node N6. Thus, the second example shown in FIG. 4 is enabled with the enable signal EBL4 of logic "1" level, and is of the NAND type.

The third example shown in FIG. 5 is of the NOR type, and is similar to the first example shown in FIG. 3 except for the n-channel enhancement type discharging transistor Qn15 replaced with a NOR gate NR1. For this reason, the other circuit components are labeled with the same references used for the first example shown in FIG. 3. The circuit behavior of the third example is only different from that of the first example in that the output signal Sout is the opposite logic level in the disable state. For this reason, description is omitted for the sake of simplicity. The third example is also of the NOR type.

The prior art signal input circuits categorized in the first group are simple, small and low-power consumption. The complementary inverters Qp1/Qn2 and Qp7/Qn8 only momentarily couple the common drain nodes N1 and N3 to one of the positive power voltage line Vdd and the ground voltage line in the switching actions thereof. However, while the input signal Sin is stable, no current flows through the complementary inverters Qp1/Qn2 and Qp7/Qn8, and the current consumption is negligible. For this reason, the prior art signal input circuits of the first group are employed in standard semiconductor integrated circuit devices.

However, the prior art signal input circuits categorized in the first group are not suitable in response characteristics to a high-speed small-amplitude input signal. One of the large markets of the semiconductor integrated circuit devices is a computer, and the computer manufacturer requests the semiconductor device manufacturer an interface responsive to a high-speed small-amplitude signal. Various new interfaces are proposed, and the GTL(Gunning Transmission Line), the CTT (Center Trapped Transmission) and Rambus interface are examples of the interfaces responsive to a high-speed small-amplitude input signal.

The prior art signal input circuits of the second group can satisfy the customer's request. The reference signal Sref is supplied to the prior art signal input together with the input signal Sin, and small potential variation of input signal is discriminative by comparing with the reference signal Sref. Moreover, the current mirror circuit rapidly develops a small potential difference. For this reason, the prior art signal input circuits of the second group are suitable for a high-speed small-amplitude input signal.

However, a problem is encountered in the prior art signal input circuit of the second group in current consumption. While the enable signals EBL3 and EBL4 disable the prior art signal input circuits, the switching transistors Qp11/Qp12 and Qn20/Qn21 cut off the current paths, and the current consumption is theoretically zero. However, if the prior art signal input circuits are enabled with the enable signals EBL3 and EBL4, currents flow through the current mirror circuits 1 and 2, and each of the prior art signal input circuits consumes a large amount of current.

If the prior art signal input circuits of the current-mirror type are employed in a dynamic random access memory device, some of the signal input circuits can not be disabled, because the dynamic random access memory device discriminates a write-in request and a read-out request from the electronic system. For this reason, the current consumption of the enabled signal input circuits is not ignoreable. A dynamic random access memory device is allowed to consume only 100 micro-ampere in the standby mode, and the self-refreshing system shares the 100 micro-ampere with the enabled signal input circuits. Therefore, the large current-consumption is problematic in the prior art signal input circuits of the current mirror type.

SUMMARY OF THE INVENTION

It is therefore an important object of the present invention to provide a semiconductor integrated circuit device with a signal input circuit which has low-power consumption and is responsive to a high-speed small-amplitude input signal.

To accomplish the object, the present invention proposes to change a complementary logic gate type signal input circuit to a current-mirror type signal input circuit after starting an internal sequence.

In accordance with the present invention, there is provided a semiconductor synchronous dynamic random access memory device which comprises: a) a memory cell array implemented by a plurality of memory cells; b) peripheral circuits operative to carry out a write-in sequence, a read-out sequence and a refreshing sequence; c) a plurality of signal input units operative to respectively receive external signals for producing internal signals, and supplying said internal signals to said peripheral circuits and said memory cell array for said write-in sequence, said read-out sequence and said refreshing sequence, at least one of said plurality of signal input units assigned to one of said external signals having a first signal input circuit and a second signal input circuit selectively enabled with an enable signal, said first signal input circuit having a current mirror stage responsive to said one of said external signals for producing one of said internal signals therefrom and a first activation stage responsive to said enable signal for making said current mirror stage responsive, said second signal input circuit having a complementary logic stage responsive to said one of said external signals for producing said one of said internal signals therefrom and a second activation stage responsive to said enable signal for making said complementary logic stage responsive; and d) a controlling unit operative to monitor some of said external signals for discriminating a predetermined condition where said semiconductor synchronous dynamic random access memory device decreases a power consumption, and changing said enable signal for activating said second signal input circuit instead of said first signal input circuit in said predetermined condition.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 6:
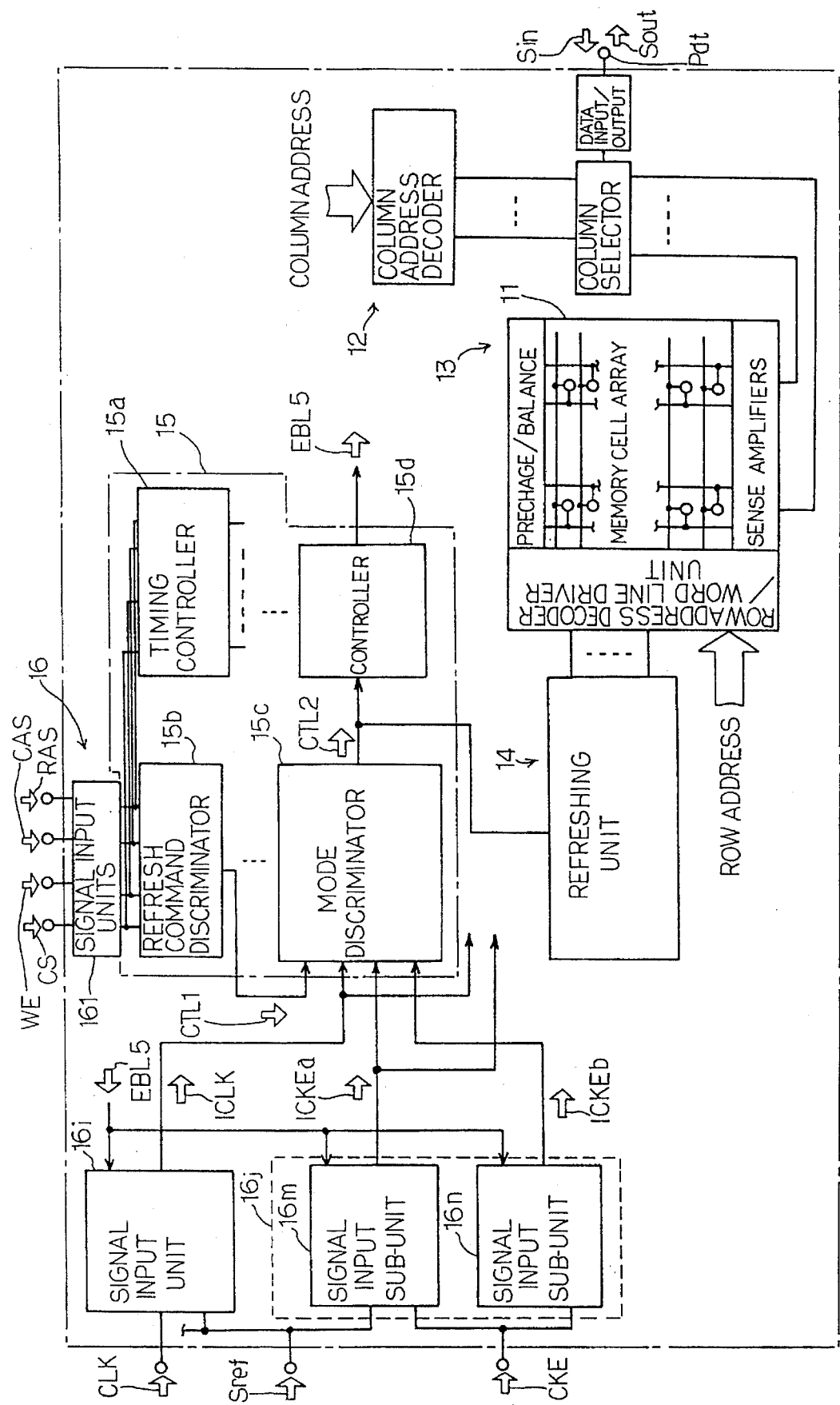
FIG. 6 is a block diagram showing a semiconductor synchronous dynamic random access memory device according to the present invention.

Referring to FIG. 6 of the drawings, a semiconductor synchronous dynamic random access memory device embodying the present invention is fabricated on a semiconductor chip 10, and largely comprises a memory cell array 11 implemented by a plurality of dynamic random access memory cells indicated by small circles, an addressing system 12 for selectively making the dynamic random access memory cells accessible, a data read/write system 13 for propagating data bits between the memory cell array 11 and a data pin Pdt, a refreshing system 14 for refreshing the data bits stored in the memory cell array 11, a timing controlling system 15 for synchronously controlling the other systems, and a signal input system 16 for providing an interface between the addressing, data read/write and timing controlling systems 12, 13 and 15 and external devices. The circuit arrangements of the memory cell array 11, the addressing system 12, the data read/write system 13 and the refreshing system 14 are known to a person skilled in the art, and the synchronous read/write sequences are also known to the person skilled in the art. For this reason, no further description is incorporated hereinbelow. In this instance, the addressing system 12, the data read/write system 13, the refreshing system 14 and parts of the timing controlling system 15 serve as peripheral circuits.

Figure 4:
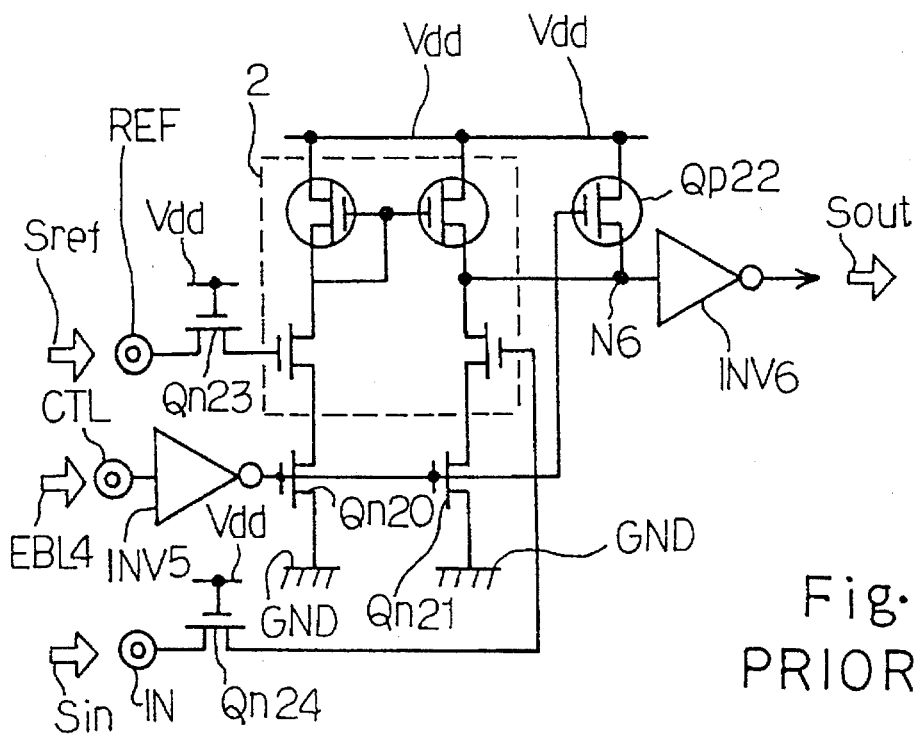
FIG. 4 is a circuit diagram showing the arrangement of the second example of the prior art signal input circuit of the current-mirror type.
Figure 5:
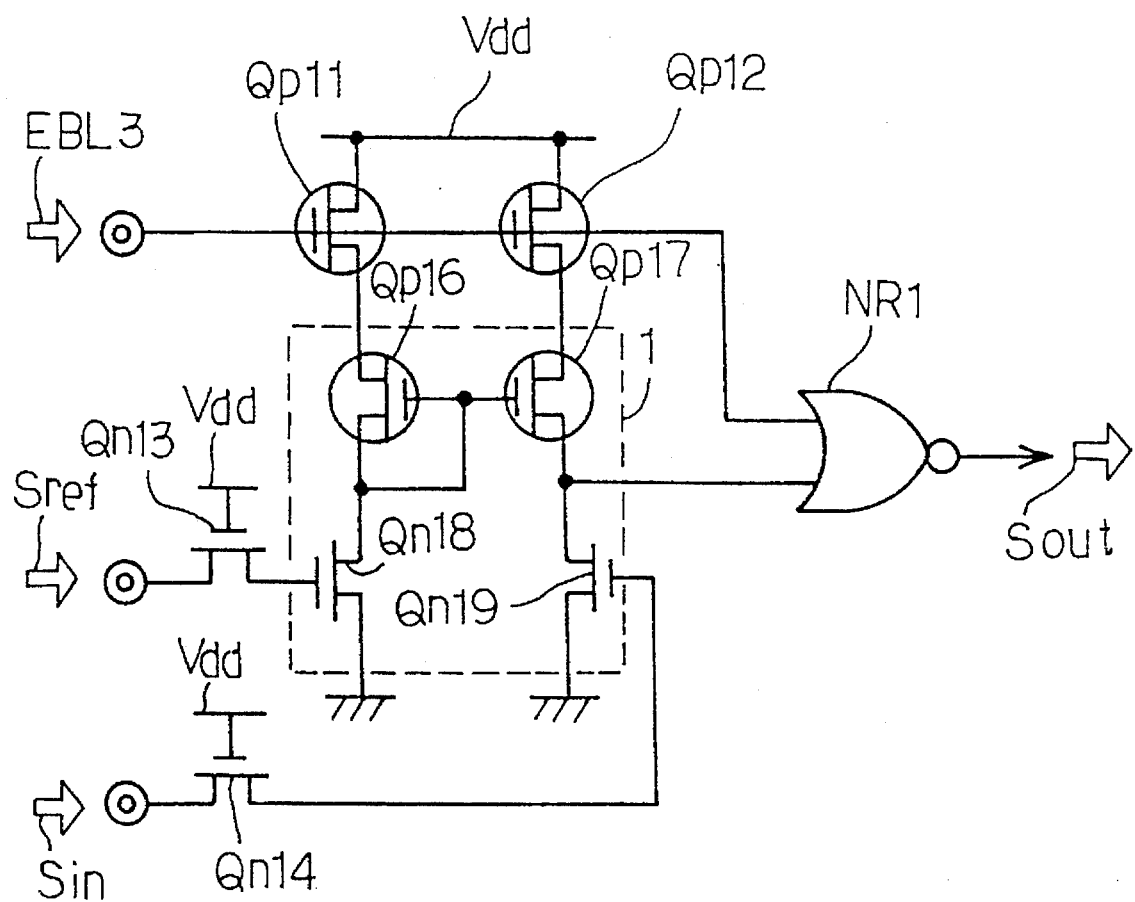
FIG. 5 is a circuit diagram showing the arrangement of the third example of the prior art signal input circuit of the current-mirror type.

The signal input system 16 comprises a plurality of signal input units 161, . . . , 16i and 16j associated with signal pins, and address signals (not shown), an input data signal Sin, a row address strobe signal RAS, a column address strobe signal CAS, a write enable signal WE, a chip select signal CS, a clock signal CLK, a reference signal Sref and a clock enable signal CKE are respectively assigned the signal pins as shown. Most of the signal input units are implemented by the signal input circuits of the current mirror type described with reference to FIGS. 3 to 5, and the threshold of the logic level is supplied through the reference signal Sref from one of the external devices. For this reason, the semiconductor synchronous dynamic random access memory device is responsive to high-speed small-amplitude external signals.

Figure 3:
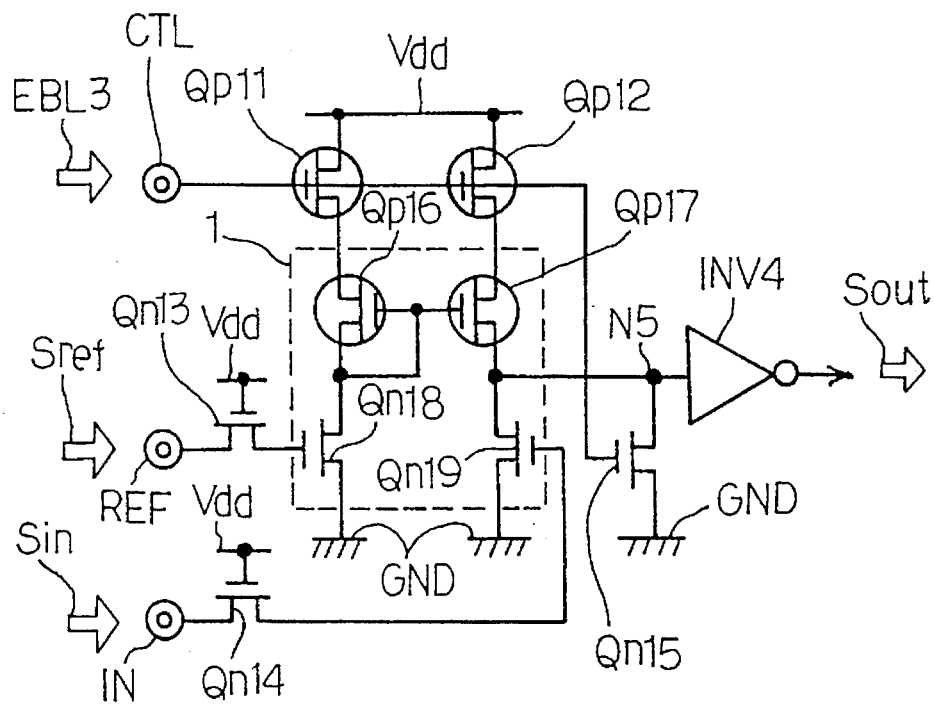
FIG. 3 is a circuit diagram showing the arrangement of the first example of the prior art signal input circuit of the current-mirror type.

The signal input unit 16i is implemented by the current-mirror type signal input unit shown in FIG. 3, and is enabled with a low level signal. While the timing control system 15 is enabling the signal input unit 16i, the signal input unit 16i produces an internal clock signal ICLK from the clock signal CLK. The internal clock signal ICLK is synchronous with the clock signal CLK.

Figure 1:
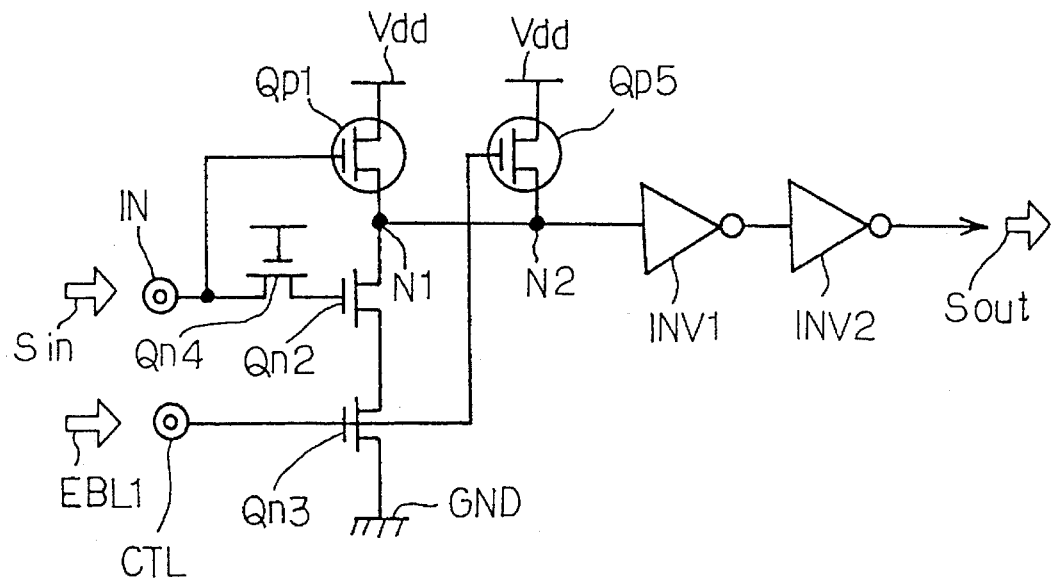
FIG. 1 is a circuit diagram showing the arrangement of the first example of the prior art signal input circuit implemented by the complementary circuit.
Figure 2:
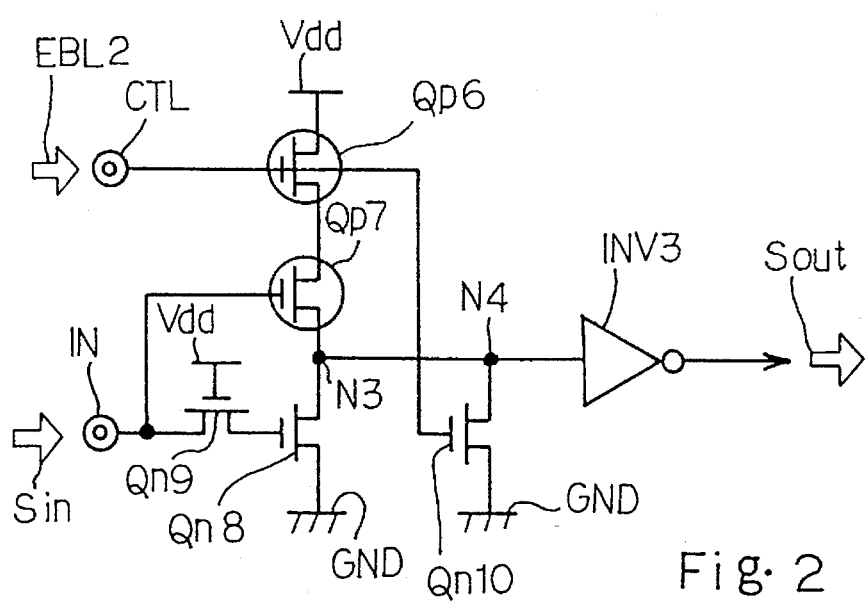
FIG. 2 is a circuit diagram showing the arrangement of the second example of the prior art signal input circuit implemented by the complementary circuit.

The signal input unit 16j is implemented by a parallel combination of a signal input sub-unit 16m of the current mirror type and a signal input sub-unit 16n of the complementary logic gate type. The signal input sub-unit 16m is implemented by the signal input circuit shown in FIG. 3, and is also enabled with a low level signal. On the other hand, the signal input sub-unit 16n is implemented by the complementary logic gate type signal input circuit shown in FIG. 1, and is enabled with a high level signal.

The clock enable signal CKE is supplied to the signal input sub-units 16m and 16n, and the signal input sub-units 16m and 16n selectively produces an internal clock enable signal ICKEa/ICKEb from the clock enable signal CKE. The internal clock enable signal ICKEa/ICKEb is synchronous with the clock enable signal CKE.

The internal clock signal ICLK and the internal clock enable signal ICKEa/ICKEb are supplied to the timing control system 15, and the timing control system 15 changes the logic level of an enable signal EBL5 for selectively enabling the two kinds of signal input circuit as will be described in detail hereinlater. The current-mirror type signal input circuits are internally enabled only when the signal input units are expected to discriminate the high-speed small-amplitude input signals, and the current consumption is drastically decreased.

The clock signal CLK is a main signal for controlling the semiconductor synchronous dynamic random access memory device, and a system clock serves as the clock signal CLK. The semiconductor synchronous dynamic random access memory device latches various command codes at the leading edges of the internal clock signal CLK, and the address signals and the input data signal Sin are also stored at the leading edges of the internal clock signal CLK.

The internal clock enable signal ICKEa/ICKEb makes the internal clock signal ICLK valid or invalid depending upon the potential level thereof. Namely, while the internal clock enable signal ICKEa/ICKEb is in the high level, the internal clock signal ICLK becomes valid. However, if the internal clock enable signal ICKEa/ICKEb is changed to the low level, the internal clock signal ICLK is invalid, and the component systems 12, 13, 14 and 15 hold the current status without proceeding. The decision of the validity is carried out by discriminating the voltage level of the internal clock enable signal ICKEa/ICKEb at each leading edge of the internal clock signal ICLK. The decision results in the clock-suspension mode and the power-down mode of the semiconductor synchronous dynamic random access memory device, by way of example. The above described decision for the validity is disclosed in U.S. Ser. No. 8/220,881.

The signal input unit 16j achieves the low-power consumption inherent in the signal input circuit of the complementary logic gate type as well as high-speed response inherent in the signal input circuit of the current-mirror type especially at an entry into a self-refreshing mode.

The timing control system 15 comprises a timing controller 15a, a refresh command discriminator 15b, a mode discriminator 15c and a controller 15d.

The external control signals such as the row address strobe signal RAS, the column address strobe signal CAS, the write enable signal WE and the chip select signal CS are supplied from the signal input units 161 to the timing controller, and the timing controller 15a controls the synchronous read/write/refresh sequences. Although the address signals and the input/output data signal Sin/Sout are received by signal input units, these signal input units are not shown in the drawings.

The mode discriminator 15c is operative to initiate the controller 15d for changing the signal input sub-unit 16n to the signal input sub-unit 16m, and the internal clock signal ICLK, the internal clock enable signal ICKEa/ICKEb and an internal control signal CTL1 indicative of a request for the self-refresh are supplied to the mode discriminator 15c. If the mode discriminator 15c determines that the request for the self-refresh, the mode discriminator 15c supplies an internal control signal CTL2 to the controller 15d, and the internal control signal CTL2 activates the controller 15d for changing an internal enable signals EBL5. The internal enable signal EBL5 is supplied to the signal input units 16i and 16j, and changes the signal input sub-unit 16n to the signal input sub-unit 16m.

Figure 7:
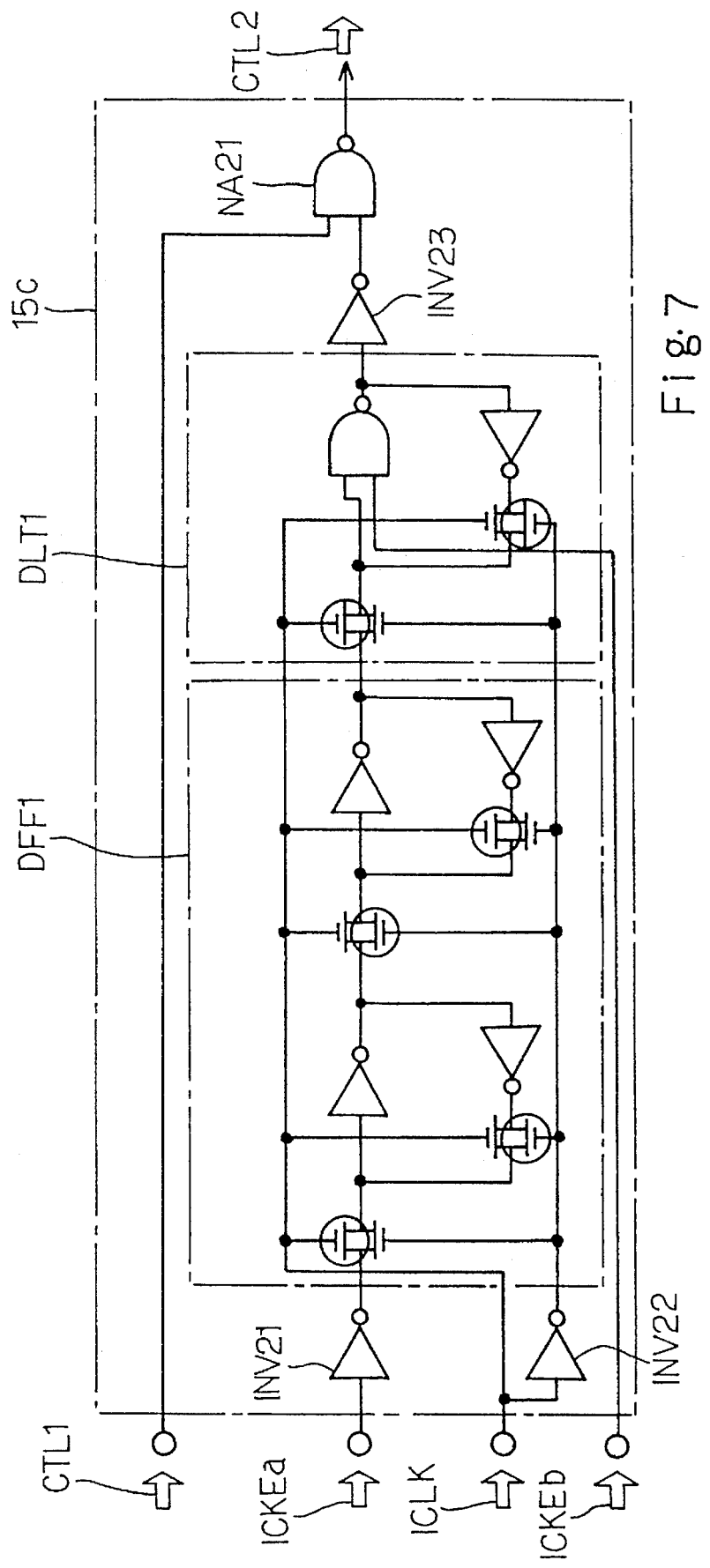
FIG. 7 is a circuit diagram showing the arrangement of a mode discriminator incorporated in the semiconductor synchronous dynamic random access memory device according to the present invention.

FIG. 7 illustrates the circuit arrangement of the mode discriminator 15c, and largely comprises a delayed flip-flop circuit DFF1, a resetable delayed latch circuit DLT1, three inverters INV21, INV22 and INV23 and a NAND gate NA21. The internal clock signal ICLK is supplied from the signal input unit 16i to the delayed flip flop circuit DFF1, and serves as a clock signal for the delayed flip flop circuit DFF1. The internal clock enable signal ICKEa is supplied from the signal input sub-unit 16m through the inverter INV21 to the delayed flip flop circuit DFF1, and the output signal of the inverter INV21 serves as an input signal for the delayed flip flop circuit DFF1.

The output signal of the delayed flip flop circuit DFF1 is supplied to the resetable delayed latch circuit DLT1, and serves as an input signal for the resetable delayed latch circuit DLT1. The internal clock signal ICLK is further supplied to the inverter INV22, and the output signal of the inverter INV22 serves as a clock signal for the resetable delayed latch circuit DLT1. The internal clock enable signal ICKEb is supplied from the signal input sub-unit 16n to the resetable delayed latch circuit DLT1, and serves as a reset signal for the resetable delayed latch circuit DLT1.

The mode discriminator 15c stores the internal clock enable signal ICKEa at a leading edge of the internal clock signal ICLK, and treats the edge of the internal clock signal ICLK in the next cycle depending upon the potential level of the internal clock enable signal ICKEa as disclosed in the previous U.S. Patent Application of the present inventor. In other words, the mode discriminator 15c enters into reset state in response to the internal clock enable signal ICKEb changing upon completion of a self-refreshing.

Figure 8:
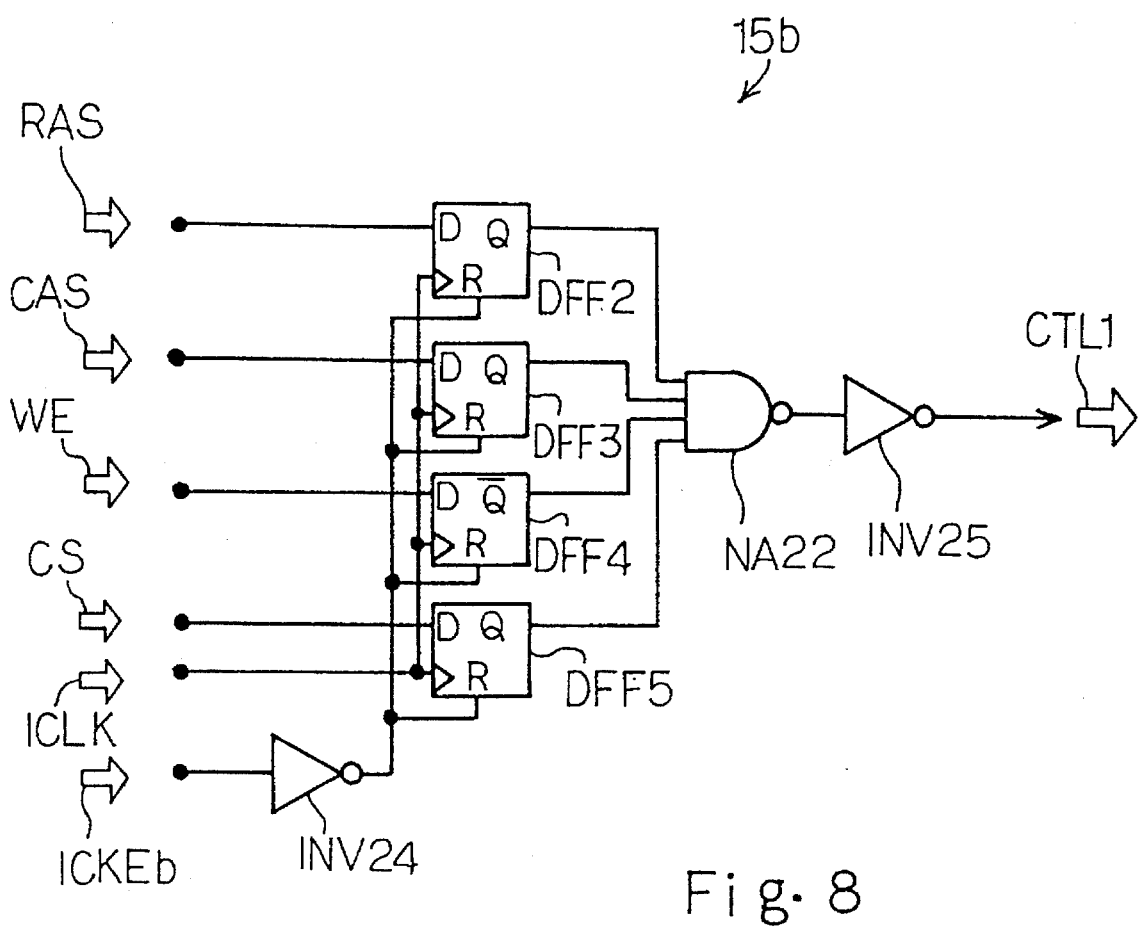
FIG. 8 is a circuit diagram showing the arrangement of a refresh command discriminator incorporated in the semiconductor synchronous dynamic random access memory device according to the present invention.

Turning to FIG. 8 of the drawings, the refresh command discriminator 15b is coupled to the signal input units 161, and discriminates a refresh command code. The refresh command discriminator 15b comprises four delayed flip flop circuits DFF2, DFF3, DFF4 and DFF5, two inverters INV24 and INV25 and a NAND gate NA22, and the refresh command code is supplied to the pins assigned to the row address strobe signal RAS, the column address strobe signal CAS, the write enable signal WE and the chip select signal CS. For this reason, the signals of the refresh command code are respectively labeled with RAS, CAS, WE and CS in FIG. 8, and the request for the refreshing is indicated by the signals RAS, CAS, WE and CS of logic "0" level, logic "0" level, logic "1" level and logic "0" level. The refresh command code is supplied from the signal input circuits 161 to the delayed flip flop circuits DFF2 to DFF5. The refresh command code is stored at the leading edge of the internal clock signal ICLK.

The internal clock enable signal ICKEb is supplied from the signal input sub-unit 16n to the inverter INV24, and the internal clock signal ICLK is supplied from the signal input unit 16i to the delayed flip flop circuits DFF2 to DFF5. The refresh command code is latched by the delayed flip flop circuits DFF2 to DFF5 in response to the internal clock signal ICLK, and the clock enable signal CKE is maintained in the low level indicative of the disable state. The refresh command is decoded by the NAND gate NA22, and the decoded signal is supplied from the NAND gate NA22 to the inverter INV25. The inverter INV25 produces the internal control signal CTL1. The semiconductor synchronous dynamic random access memory device remains in the refresh mode in so far as the clock enable signal CKE is not recovered to the high level. If the clock enable signal CKE is in the high level indicative of the enabled state, the refresh command code is indicative of a standard refreshing, and the semiconductor synchronous dynamic random access memory device returns to initial state upon completion of a single cycle of the refreshing sequence. While the semiconductor synchronous dynamic random access memory device is being in the self-refreshing mode, the clock enable signal CKE is maintained in the low level, and the internal clock signal ICLK is inactive. For this reason, the other external signals are not taken care.

Figure 9:
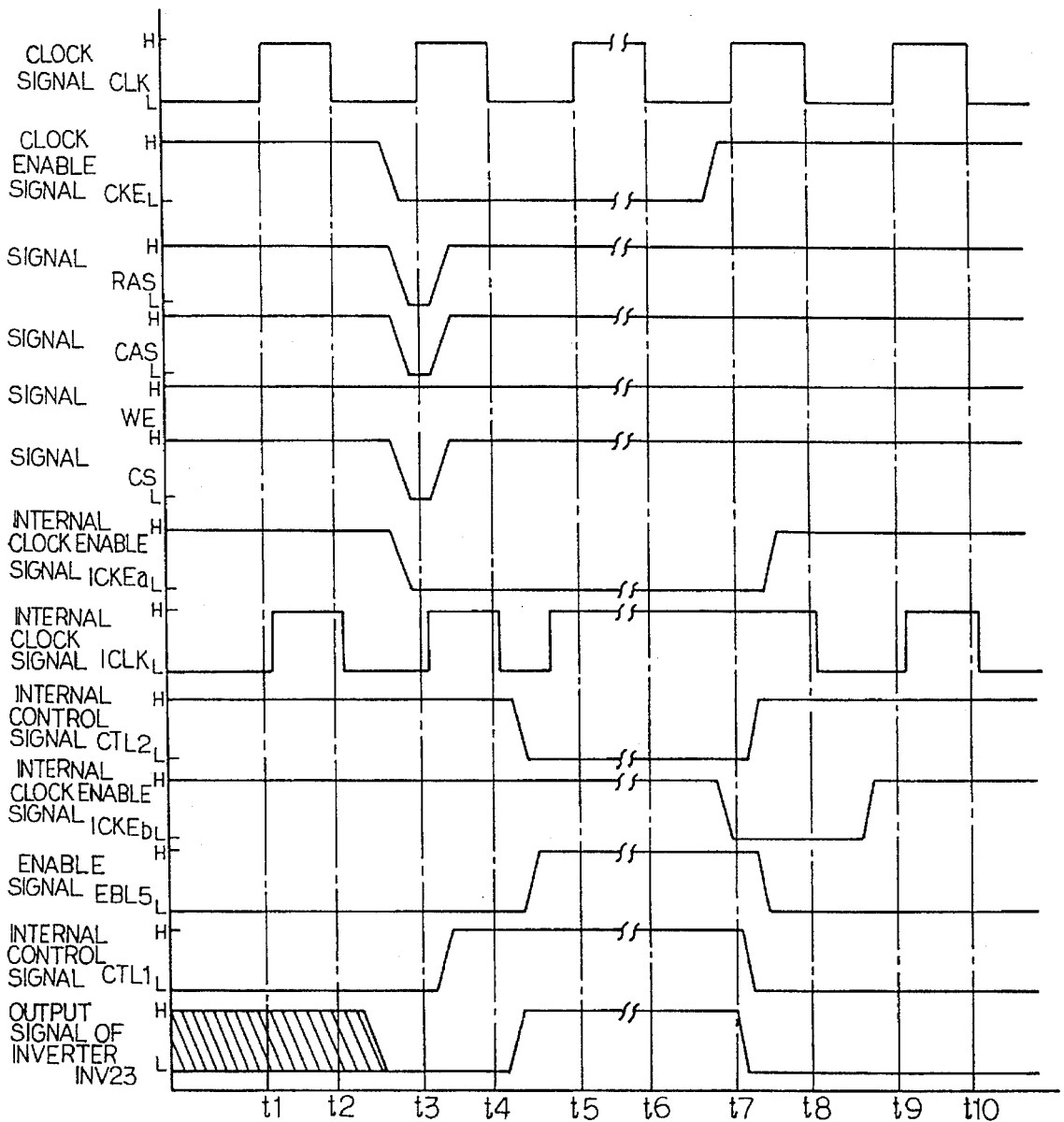
FIG. 9 is a timing chart showing the behavior of the mode discriminator.

Turning to FIG. 9 of the drawings, the clock signal CLK periodically rises at times t1, t3, t5, t7, t9, . . . , and is decayed from the high level (H) to the low level (L) at time t2, t4, t6, t8, t10, . . . . The clock enable signal CKE is initially maintained in the high level, and is decayed to the low level at the leading edge of the clock signal CLK at time t3 with a set-up time. The refresh command code does not reach the pins at time t1, and, accordingly, the internal control signal CTL1 is maintained in the low level. The NAND gate NA21 keeps the internal control signal CTL2 in the high level regardless of the logic level of the output signal of the inverter INV23, and the enable signal EBL5 is maintained in the low level. For this reason, the current-mirror type signal input unit 16i and the current-mirror type signal input sub-unit 16m are enabled with the enable signal EBL5, and the complementary logic gate type signal input sub-unit 16n is disabled. As a result, the internal clock signal ICLK is changed in synchronism with the clock signal CLK, and a small amount of delay time is introduced between the clock signal CLK and the internal clock signal ICLK. Though not labeled along the abscissa in FIG. 9, the timings for the internal clock signal ICLK are referred to with suffix "'" together with the corresponding timings for the clock signal CLK. For example, time t1' is indicative of the leading edge of the internal clock signal ICLK in synchronism with the leading edge of the clock signal CLK at time t1. The internal clock enable signal ICKEa follows the clock enable signal CKE, and the internal clock signal ICKEb is fixed to the high level.

The high level of the internal clock enable signal ICKEa is stored in the delayed flip flop circuit DFF1 in synchronism with the leading edge at time t1' and the low level of the output signal of the inverter INV23 is determined at time t3'.

The refresh command code is supplied to the delayed flip flop circuits DFF2 to DFF5 well before time t3, and the delayed flip flop circuits DFF2 to DFF5 store the refresh command code in synchronism with the leading edge of the internal clock signal ICLK at time t3', and the inverter INV25 changes the internal control signal CTL1 to the high level at time t3'.

The clock enable signal CKE is in the low level indicative of the self-refreshing at time t4, and the delayed latch circuit DLT1 causes the inverter INV23 to change the output signal thereof to the high level at time t4'. As a result, the NAND gate NA21 changes the internal control signal CTL2 to the low level, and the request for the self-refresh is internally acknowledged.

If the refresh command code is not supplied to the refresh command discriminator 15b before time t3, the internal control signal CTL1 is maintained in the low level, and the semiconductor synchronous dynamic random access memory device enters into the clock suspension mode or a power-down mode. Moreover, if the refresh command code is supplied to the refresh command discriminator in the presence of the clock enable signal CKE of the high level, the semiconductor synchronous dynamic random access memory device acknowledges the standard refresh, and the refresh sequence is carried out by only one cycle. In this situation, even if the clock enable signal CKE is changed to the low level at time t5, the semiconductor synchronous dynamic random access memory device enters into the power-down mode for the standard refreshing, but does not enter into the self-refreshing. This is because of the fact that the internal control signal CTL1 releases the mode discriminator 15c from the request for self-refreshing at the leading edge of the internal clock signal ICLK at time t5' before the low level of the clock enable signal CKE affects the output signal of the inverter INV23 at time t6.

Upon discriminating the self-refresh mode, the internal control signal CTL2 is changed to the low level at time t4', and the enable signal EBL5 is changed from the low level to the high level.

The enable signal EBL5 of the high level disables the signal input unit 16i and the signal input sub-unit 16m, and enables the signal input sub-unit 16n. The signal input unit 16i thus disabled fixes the internal clock signal to the high level, and the delayed flip flop circuit DFF1 and the delayed latch circuit DLT1 keep the respective internal states at the entry into the self-refreshing. Namely, the inverter INV23 keeps the output signal in the high level. Similarly, the refresh command discriminator 15b maintains the internal control signal CTL1 in the high level, because the internal clock signal ICLK can not reset the delayed flip flop circuits DFF2 to DFF5.

On the other hand, the current-mirror type signal input sub-unit 16m is disabled with the enable signal EBL5, and the internal clock enable signal ICKEa is fixed to the low level. Although the other current-mirror signal input circuit is available for the signal input sub-unit 16m, the internal clock enable signal ICKEa of the high level may be causative of a malfunction, and the internal clock enable signal ICKEa of the low level is desirable during the self-refreshing.

The complementary logic gate type signal input sub-unit 16n thus enabled with the enable signal EBL5 keeps the internal clock enable signal ICKEb in the high level after the entry into the self-refreshing, because the clock enable signal CKE is still maintained in the low level.

Thus, all of the current-mirror type signal input unit/sub-unit are disabled upon entry into the self-refreshing, and no current is consumed therein. Only the signal input sub-unit 16n is enabled for receiving the clock enable signal CKE, and the current consumption of the signal input sub-unit 16n of the complementary logic gate type is almost zero, because the clock enable signal CKE is maintained in the low level until the recovery from the self-refreshing.

The clock enable signal CKE is changed to the high level at time t7, and the semiconductor synchronous dynamic random access memory device starts the recovery from the self-refreshing. In detail, when the clock enable signal CKE is changed to the high level, the signal input sub-unit 16n, which is only one signal input unit enabled in the self-refreshing, changes the internal clock enable signal ICKEb to the low level regardless of the clock signal CLK, and the resetable delayed latch circuit DLT1 causes the inverter INV23 to change the output signal to the low level. As a result, the NAND gate NA21 changes the internal control signal CTL2 to the high level.

The internal control signal CTL2 of the high level is supplied to the controller 15d, and the controller 15d changes the enable signal EBL5 to the low level. The enable signal EBL5 of the low level disables the signal input sub-unit 16n, and the signal input unit 16i and the signal input sub-unit 16m are enabled with the enable signal EBL5. The signal input sub-unit 16m allows the internal clock enable signal ICKEa to follow the clock enable signal CKE, and the semiconductor synchronous dynamic random access memory device is recovered from the self-refreshing mode to the standard mode, i.e., the synchronous write-in mode and the synchronous read-out mode.

In this instance, when semiconductor synchronous dynamic random access memory device is twice toggled with the clock signal CLK in the presence of the clock enable signal CKE of the high level, the semiconductor synchronous dynamic random access memory device is recovered from the self-refreshing mode. The current mirror type signal input unit 16i is rapidly activated after the change of the clock enable signal CKE to the high level, and the leading edge of the clock signal CLK at time t7 causes the delayed flip flop circuit DFF1, the resetable delayed latch circuit DLT1 and the delayed flip flop circuits DFF2 to DFF5 to change the respective levels indicative of the exit from the self-refreshing mode. Namely, the internal control signal CTL1 is changed to the low level, and the output signal of the inverter INV23 is changed to the low level. The output signal of the resetable delayed latch circuit DLT1 does not allow the inverter INV23 to change the output signal to the high level indicative of the entry into the self-refreshing mode.

However, according to the present invention, it is possible to make the toggles with the clock signal CLK unnecessary after the change of the clock enable signal CKE to the high level required for the exit from the self-refreshing by using the internal clock enable signal ICKEb as a reset signal for the delayed flip flop circuits DFF2 to DFF5. In detail, the delayed flip flop circuits DFF2 to DFF5 of the refresh command discriminator 15b are supplied with the signals RAS, CAS, WE and CS at time t3. However, it is unnecessary to keep the levels of these signals RAS, CAS, WE and CS at the exit from the self-refreshing, and only a data reset on the slave side changes the internal control signal CTL1 to the low level. For this reason, the semiconductor synchronous dynamic random access memory device is released from the self-refreshing without resets of the delayed flip flop circuit DFF1 and the delayed latch circuit DLT1 by using the toggles of the clock signal CLK.

As will be appreciated from the foregoing description, only the signal input sub-unit 16n of the complementary logic gate type watches the clock enable signal CKE during the self-refreshing, and the current consumption is drastically decreased. On the other hand, the signal input sub-unit/unit 16m and 16i of the current mirror type respectively respond to the high-speed small-amplitude clock enable signal CKE and the high-speed small-amplitude clock signal CLK in the standard mode, and a malfunction does not take place.

Second Embodiment

Figure 10:
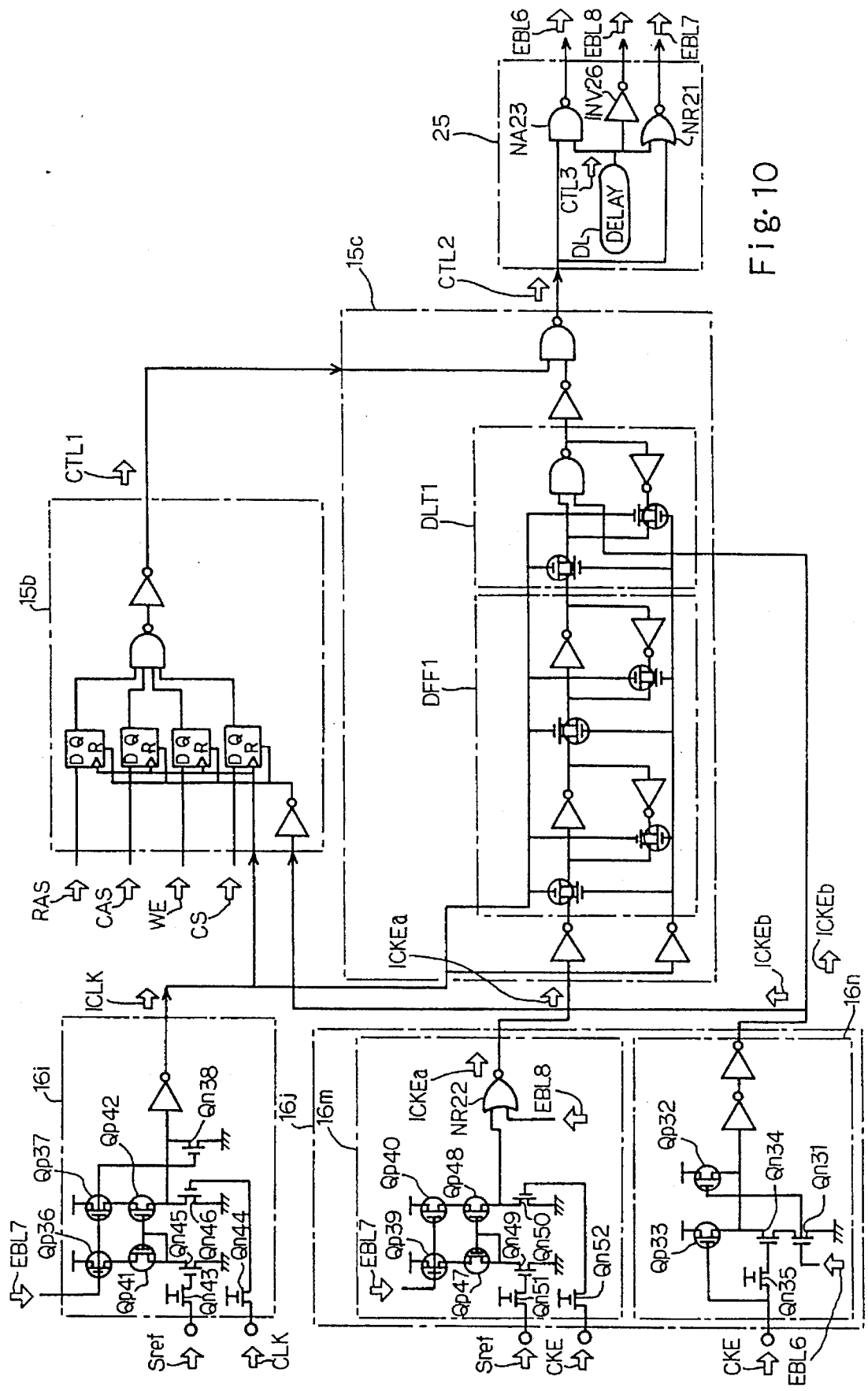
FIG. 10 is a circuit diagram showing the arrangement of essential parts of another semiconductor synchronous dynamic random access memory device according to the present invention.

Turning to FIG. 10 of the drawings, essential parts incorporated in another semiconductor synchronous dynamic random access memory device are illustrated, and the semiconductor synchronous dynamic random access memory device implementing the second embodiment is similar to that of the first embodiment except for a controller 25. For this reason, description is focused on the controller 25 only, and other circuits are labeled with the same references designating the corresponding circuits of the first embodiment without detailed description.

Figure 11:
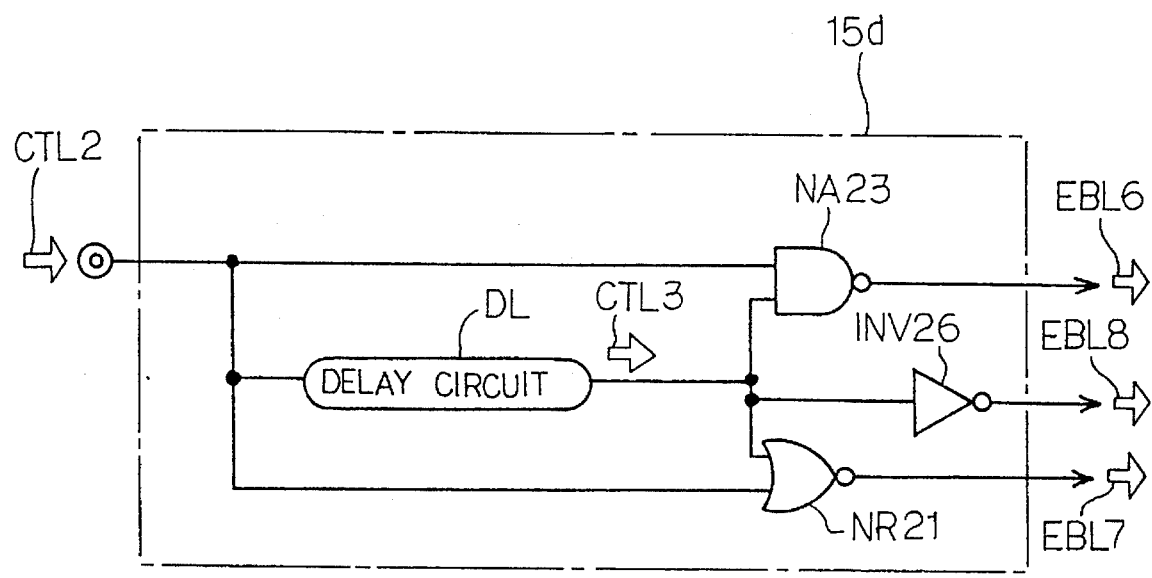
FIG. 11 is a circuit diagram showing the arrangement of a controller incorporated in the semiconductor synchronous dynamic random access memory device shown in FIG. 10.

As will be better seen from FIG. 11, the controller 25 comprises a delay circuit DL, a NAND gate NA23, a NOR gate NR21 and an inverter INV26, and the internal control signal CTL2 is supplied to the NAND gate NA23, the delay circuit DL and the NOR gate NR21. The internal control signal CTL2 is supplied from the mode discriminator 15c to the NAND gate NA23 and the NOR gate NR21, and the NAND gate NA23 and the NOR gate NR21 are complementarily enabled with the internal control signal CTL2. The internal control signal CTL2 is further supplied to the delay circuit DL, and the delay circuit DL introduce time delay TD for producing an internal delayed control signal CTL3. The internal delayed control signal CTL3 is supplied to the NAND gate NA23, the NOR gate NR21 and the inverter INV26, and three enable signals EBL6, EBL7 and EBL8 are produced by the NAND gate NA23, the NOR gate NR21 and the inverter INV26, respectively.

The enable signal EBL6 is supplied to the signal input sub-unit 16n of the complementary logic gate type, and an n-channel enhancement type switching transistor Qn31 and a p-channel enhancement type switching transistor Qp32 are gated by the enable signal EBL6. The enable signal EBL6 is active in the high level. The p-channel enhancement type switching transistor Qp32 and the n-channel enhancement type switching transistor Qn31 form in combination an activation stage or an enabling stage of the signal input sub-unit 16n. Other switching transistors Qp33, Qn34 and Qn35 as a whole constitute a complementary logic stage of the signal input sub-unit 16n.

The enable signal EBL7 is supplied to the signal input unit 16i and the signal input sub-unit 16m, and simultaneously enables these unit/sub-unit 16i and 16m. The enable signal EBL7 is active in low level. In detail, p-channel enhancement type switching transistors Qp36 and Qp37 and an n-channel enhancement type switching transistor Qn38 are gated by the enable signal EBL7, and form in combination an activation stage or an enabling stage of the signal input unit 16i. P-channel enhancement type switching transistors Qp39 and Qp40 are also gated by the enable signal EBL7, and as a whole constitute an activation stage or an enabling stage. Other field effect transistors Qp41, Qp42, Qn43, Qn44, Qn45 and Qn46 form in combination a current mirror stage of the signal input unit 16i, and field effect transistors Qp47, Qp48, Qn49, Qn50, Qn51 and Qn52 constitute a current mirror stage of the signal input sub-unit 16m.

The enable signal EBL8 is supplied to the signal input sub-unit 16m, and a NOR gate NR22 is enabled with the enable signal EBL8. The enable signal EBL8 is active in low level.

Figure 12:
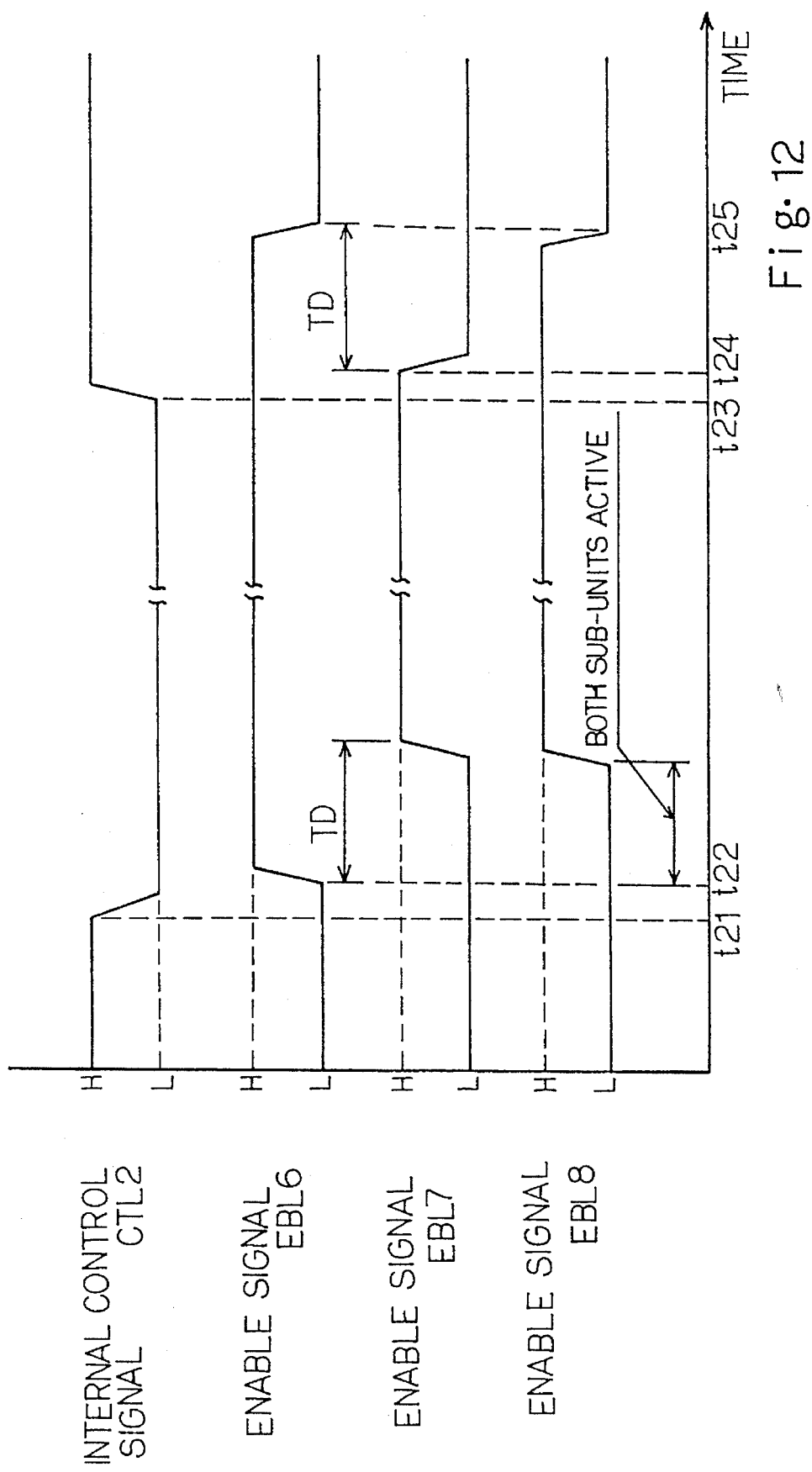
FIG. 12 is a timing chart showing the circuit behavior of the controller.

The circuit behavior of the controller 25 is illustrated in FIG. 12 of the drawings. Assuming now that the internal control signal CTL2 is changed to the low level at time t21, the NAND gate NA23 is disabled, and the NOR gate NR21 is enabled. The NAND gate NA23 changes the enable signal EBL6 to the active high level at time t22, and the signal input sub-unit 16n is activated with the enable signal EBL6.

After the time delay TD, the internal delayed control signal CTL3 causes the NOR gate NR21 to change the enable signal EBL7 to the inactive high level, and the enable signal EBL7 of the inactive high level disable the signal input unit 16i and the signal input sub-unit 16m.

Thus, both signal input sub-units 16m and 16n are active in the time period TD, and prevent the semiconductor synchronous dynamic random access memory device from undesirable exit from the self-refreshing mode.

If the internal control signal CTL2 is recovered to the high level at time t23, the NOR gate NR21 is disabled, and the NAND gate NA23 is enabled. The disabled NOR gate NR21 changes the enable signal EBL7 to the active low level at time t24, and the enable signal EBL7 of the active low level activates the signal input unit 16i and the signal input sub-unit 16m. The signal input unit 16i immediately starts the generation of the internal clock signal ICLK. However, the signal input sub-unit 16m waits for the enable signal EBL8.

The delay circuit DL changes the internal delayed control signal CTL3 to the high level at time t25, and the NAND gate NA23 and the inverter INV26 change the enable signals EBL6 and EBL8 to the low level. The enable signal EBL6 of the inactive low level disables the signal input sub-unit 16n and the enable signal EBL8 of the active low level allows the signal input sub-unit 16m to produce the internal clock enable signal ICKEa. The enable signal EBL8 prevents the signal input sub-unit 16m from hazard.

The semiconductor synchronous dynamic random access memory device implementing the second embodiment achieves all of the advantages of the present invention.

Third Embodiment

Figure 13:
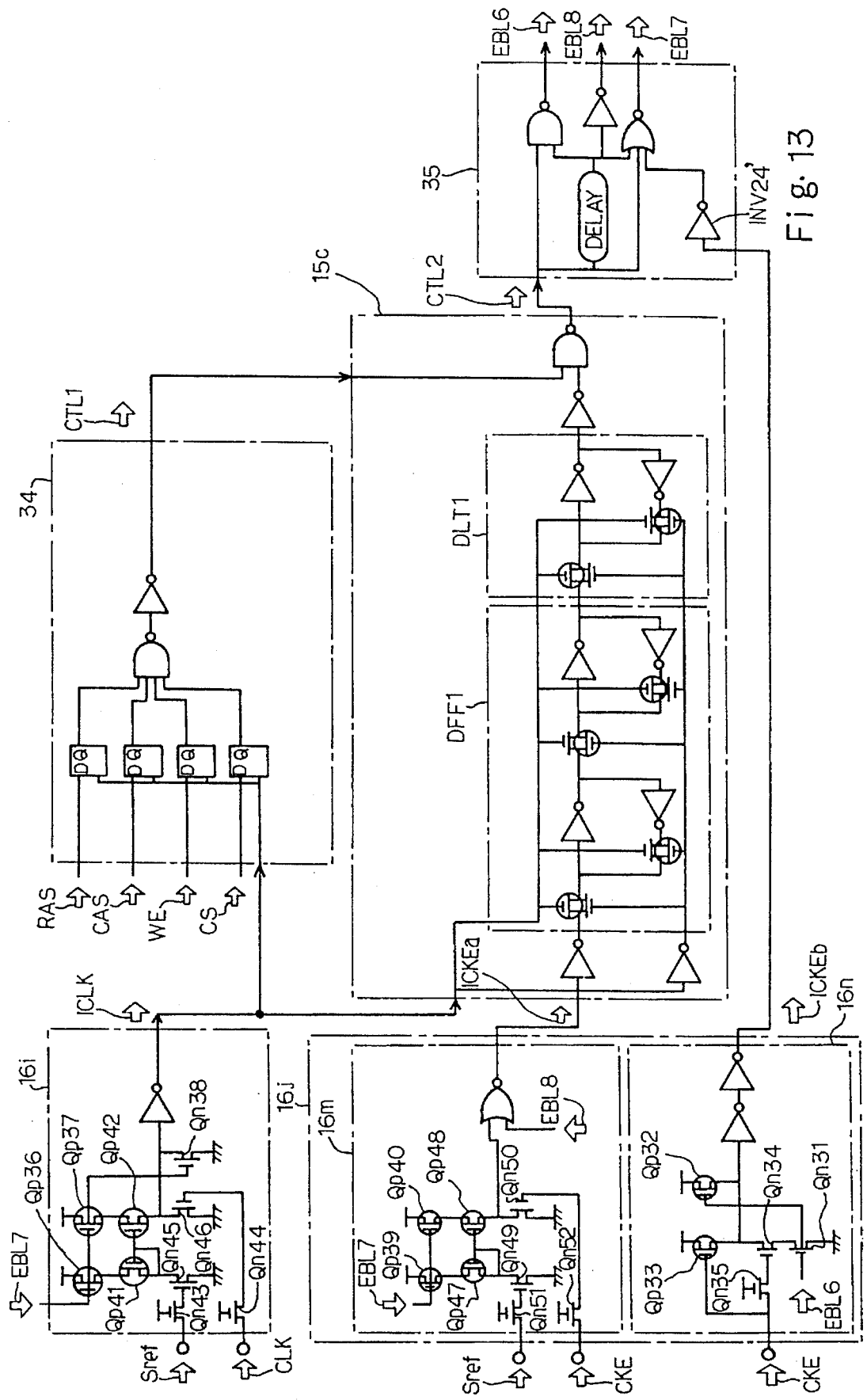
FIG. 13 is a circuit diagram showing the arrangement of yet another semiconductor synchronous dynamic random access memory device according to the present invention.

Turning to FIG. 13 of the drawings, essential parts of yet another semiconductor synchronous dynamic random access memory device is illustrated. The semiconductor synchronous dynamic random access memory device implementing the third embodiment is similar to that of the second embodiment except for the inverter INV24' relocated from the refresh command discriminator 34 to the controller 35. For this reason, other components are labeled with the same references designating the corresponding components of the second embodiment without detailed description.

The internal clock enable signal ICKEb is supplied to the inverter INV24 of the controller 35, and behaves as similar to those of the first and second embodiments at the entry into the self-refreshing mode.

Figure 14:
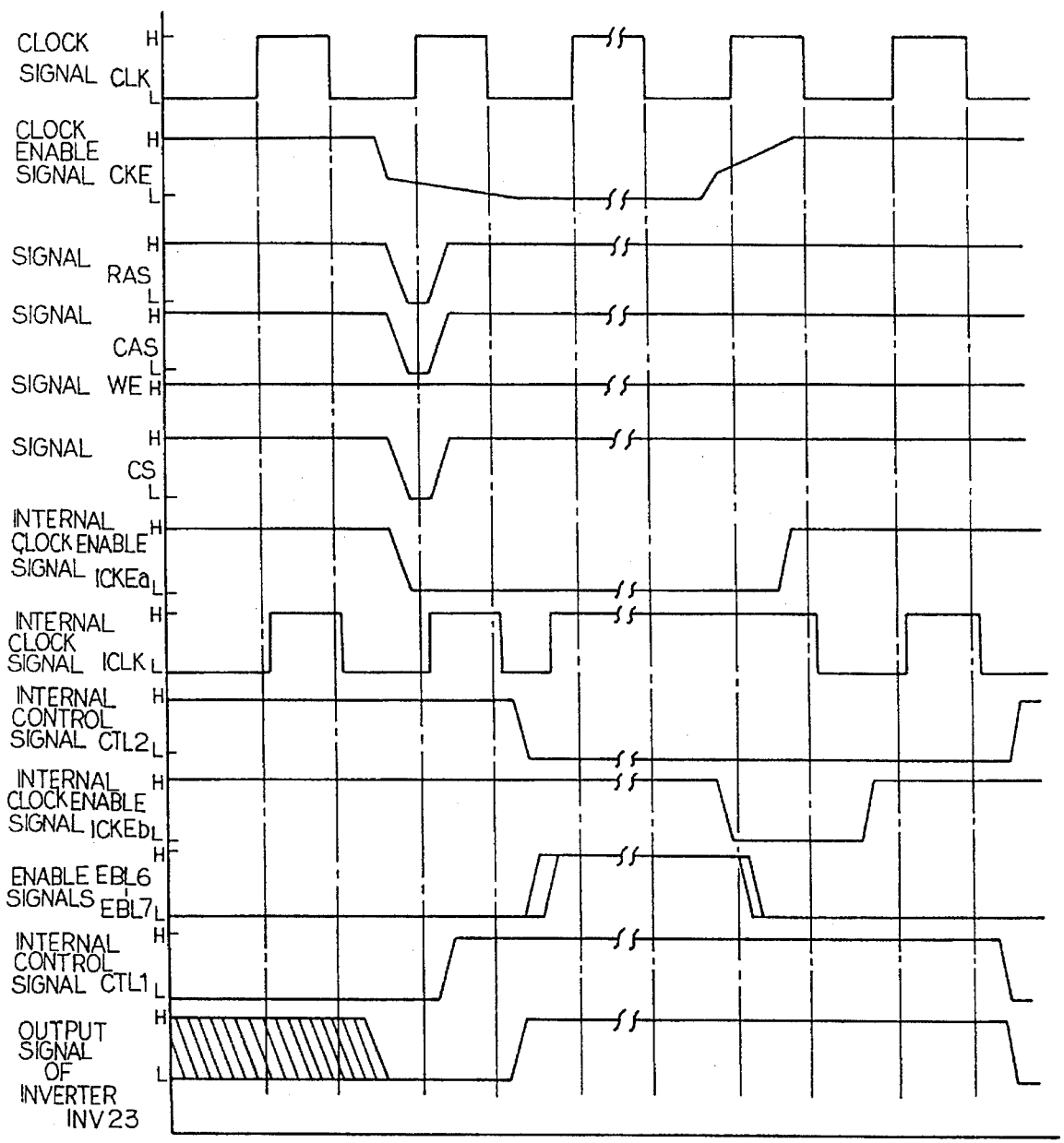
FIG. 14 is a timing chart showing a behavior of the semiconductor synchronous dynamic random access memory device in a self-refreshing mode.

An entry into the self-refresh and an exit from the self-refreshing are illustrated in FIG. 14 of the drawings. The entry into the self-refreshing is identical with the entry shown in FIG. 9.

However, the exit from the self-refreshing mode is carried out through a detection of the level change of the clock enable signal CKE by the signal input sub-unit 16n.

As will be appreciated from the foregoing description, while the semiconductor synchronous dynamic random access memory device according to the present invention is in the self-refreshing mode, the signal input sub-unit 16n of the complementary logic gate type decreases the current consumption in the signal input system 16 to approximately zero.

Moreover, when the signal input unit is changed to the interface levels of GTL or CTT, the threshold of the signal input sub-unit of the complementary logic gate type is regulated to a certain level between the low level of the CMOS range and the low level of the GTL interface or the CTT interface. If the input signal level further exceeds, the signal input sub-unit 16m of the current mirror type is available for entering into the standard mode.

Although particular embodiments of the present invention have been shown and described, it will be obvious to those skilled in the art that various changes and modifications may be made without departing from the spirit and scope of the present invention. For example, the signal input system according to the present invention may be incorporated in another semiconductor memory device, a custom-made semiconductor integrated circuit device, a semicustom-made semiconductor integrated circuit device or a microprocessor.

What is claimed is:

1. A semiconductor synchronous dynamic random access memory device:

a) a memory cell array implemented by a plurality of memory cells;

b) peripheral circuits operative to carry out a write-in sequence, a read-out sequence and a refreshing sequence;

c) a plurality of signal input units operative to respectively receive external signals for producing internal signals, and supplying said internal signals to said peripheral circuits and said memory cell array for said write-in sequence, said read-out sequence and said refreshing sequence, at least one of said plurality of signal input units assigned to one of said external signals, having a first signal input circuit and a second signal input circuit selectively enabled with an enable signal, said first signal input circuit having a current mirror stage responsive to said one of said external signals for producing one of said internal signals therefrom and a first activation stage responsive to said enable signal for making said current mirror stage responsive, said second signal input circuit having a complementary logic stage responsive to said one of said external signals for producing another one of said internal signals therefrom and a second activation stage responsive to said enable signal for making said complementary logic stage responsive; and d) a controlling unit operative to monitor some of said external signals for discriminating a predetermined condition where said semiconductor synchronous dynamic random access memory device decreases a power consumption, and changing said enable signal for activating said second signal input circuit instead of said first signal input circuit in said predetermined condition.

2. A semiconductor synchronous dynamic random access memory device having a self-refreshing mode, comprising:

a) a memory cell array having a plurality of addressable memory cells;

b) peripheral circuits associated with said memory cell array for carrying out at least a write-in sequence, a read-out sequence and a self-refreshing sequence;

c) a plurality of signal input units respectively assigned to external signals for producing internal signals selectively supplied to said memory cell array and said peripheral circuits, and having a first signal input unit having a first current mirror stage operative to produce an internal clock signal from one of said external signals, and a first activation stage responsive to an enable signal for activating said first current mirror stage, and a second signal input unit implemented by a first signal input circuit and a second signal input circuit selectively enabled with said enable signal, said first signal input circuit having a first current mirror stage operative to produce a first internal clock enable signal from another of said external signals and a second activation stage responsive to said enable signal for activating said second current mirror stage, said second signal input circuit having a complementary logic stage operative to produce a second internal clock enable signal from said another of said external signals and a third activation stage responsive to said enable signal for activating said complementary logic gate stage; and d) a controlling means associated with said first signal input unit and said second signal input unit, and responsive to some of said external signals indicative of a request for a self-refreshing in synchronism with said second internal clock signal in the presence of said internal clock enable signal in a first level so as to change an indication of said enable signal from said first signal input unit and said first signal input circuit to said second signal input circuit, said controlling means being further responsive to said second internal clock enable signal of a second level opposite to said first level for changing said indication of said enable signal from said second signal input circuit to said first signal input unit and said first signal input circuit.

3. The semiconductor synchronous dynamic random access memory device as set forth in claim 2, in which said controlling means has d-1) a refresh command discriminator responsive to said internal clock signal for storing said some of said external signals, said refresh command discriminator changing a first internal control signal to an active level when said some of said external signals are stored, said refresh command discriminator changing said first internal control signal to an inactive level when said second signal input circuit produces said second internal clock enable signal, d-2) a mode discriminator responsive to said internal clock signal in the presence of said internal clock enable signal in said first level for changing a second internal control signal to an active level indicative of an entry into said self-refreshing mode, said first internal control signal of an inactive level causing said mode discriminator to change said second internal control signal to an inactive level indicative of an exit from said self-refreshing mode, and d-3) a controller responsive to said second internal control signal for producing said enable signal.

4. The semiconductor synchronous dynamic random access memory device as set forth in claim 2, in which said enable signal has a first enable sub-signal supplied to said third activation stage, a second enable sub-signal supplied to said first activation stage and said second activation stage and a third enable sub-signal supplied to an output logic gate of said first signal input circuit for allowing said first signal input circuit to output said first internal clock enable signal.

5. The semiconductor synchronous dynamic random access memory device as set forth in claim 2, in which said controlling means has d-1) a refresh command discriminator responsive to said internal clock signal for storing said some of said external signals, and changing a first internal control signal to an active level when said some of said external signals are stored, d-2) a mode discriminator responsive to said internal clock signal in the presence of said internal clock enable signal in said first level for changing a second internal control signal to an active level indicative of an entry into said self-refreshing mode, said first internal control signal of an inactive level causing said mode discriminator to change said second internal control signal to an inactive level indicative of an exit from said self-refreshing mode, and d-3) a controller responsive to said second internal control signal for producing said enable signal, said controller being further responsive to said second internal clock enable signal supplied from said second signal input circuit for canceling said enable signal.

6. The semiconductor synchronous dynamic random access memory device as set forth in claim 5, in which said enable signal has a first enable sub-signal supplied to said third activation stage, a second enable sub-signal supplied to said first activation stage and said second activation stage and a third enable sub-signal supplied to an output logic gate of said first signal input circuit for allowing said first signal input circuit to output said internal clock enable signal.

* * * * *